United States Patent
Nakano

(10) Patent No.: US 12,439,503 B2
(45) Date of Patent: Oct. 7, 2025

(54) TARGET SUPPLY DEVICE AND ELECTRONIC DEVICE MANUFACTURING METHOD

(71) Applicant: Gigaphoton Inc., Tochigi (JP)

(72) Inventor: Masaki Nakano, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 172 days.

(21) Appl. No.: 18/531,096

(22) Filed: Dec. 6, 2023

(65) Prior Publication Data
US 2024/0260164 A1 Aug. 1, 2024

(30) Foreign Application Priority Data
Jan. 26, 2023 (JP) .................. 2023-010363

(51) Int. Cl.
*H05G 2/00* (2006.01)
*G03F 7/00* (2006.01)
*G03F 7/20* (2006.01)

(52) U.S. Cl.
CPC ....... *H05G 2/0023* (2024.08); *G03F 7/70033* (2013.01); *G03F 7/7065* (2013.01); *G03F 7/706849* (2023.05)

(58) Field of Classification Search
CPC ............... G03F 7/70033; G03F 7/7065; G03F 7/706849; H05G 2/0023
See application file for complete search history.

(56) References Cited

U.S. PATENT DOCUMENTS

| | | | |
|---|---|---|---|
| 7,405,416 B2 | 7/2008 | Algots et al. | |
| 9,544,982 B2 | 1/2017 | Zhao et al. | |
| 10,251,253 B2 | 4/2019 | Iwamoto et al. | |
| 10,506,697 B2 | 12/2019 | Iwamoto et al. | |
| 2011/0233429 A1* | 9/2011 | Vaschenko | H05G 2/002 250/492.1 |
| 2019/0333655 A1* | 10/2019 | Schröder | G21K 1/062 |

FOREIGN PATENT DOCUMENTS

JP     2001-152138 A     6/2001

* cited by examiner

*Primary Examiner* — Mark R Gaworecki
(74) *Attorney, Agent, or Firm* — Studebaker Brackett PLLC

(57) ABSTRACT

A target supply device is configured to supply a liquid state target substance including tin to a concentration position of laser light to generate EUV light. The target supply device includes a tank configured to contain the target substance; and a nozzle communicating with an inside of the tank, and having a nozzle hole through which the target substance passes. Here, an uneven structure is formed on a surface of the nozzle provided with the nozzle hole and facing the concentration position and exhibits tin repellency larger than tin repellency exhibited by a material of the surface.

11 Claims, 27 Drawing Sheets

| D (μm) | 10 | 20 | 50 | 100 |
|---|---|---|---|---|
| P (μm) | < 0.2 | < 0.4 | < 1.0 | < 2.0 |
| $f_1$ (μm) | < 0.1 | < 0.2 | < 0.5 | < 1.0 |
| $f_2$ (μm) | < 0.1 | < 0.2 | < 0.5 | < 1.0 |
| h (μm) | 0.2 | 0.4 | 1.0 | 2.0 |

TARGET SUPPLY DEVICE AND ELECTRONIC DEVICE MANUFACTURING METHOD

CROSS-REFERENCE TO RELATED APPLICATIONS

The present application claims the benefit of Japanese Patent Application No. 2023-010363, filed on Jan. 26, 2023, the entire contents of which are hereby incorporated by reference.

BACKGROUND

1. Technical Field

The present disclosure relates to a target supply device and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. Pat. No. 7,405,416
Patent Document 2: U.S. patent Ser. No. 10/251,253
Patent Document 3: U.S. patent Ser. No. 10/506,697
Patent Document 4: Japanese Patent Application Publication No. 2001-152138
Patent Document 5: U.S. Pat. No. 9,544,982

SUMMARY

A target supply device according to an aspect of the present disclosure is configured to supply a liquid state target substance including tin to a concentration position of laser light to generate EUV light. The target supply device includes a tank configured to contain the target substance; and a nozzle communicating with an inside of the tank, and having a nozzle hole through which the target substance passes. Here, an uneven structure is formed on a surface of the nozzle provided with the nozzle hole and facing the concentration position and exhibits tin repellency larger than tin repellency exhibited by a material of the surface.

An electronic device manufacturing method according to an aspect of the present disclosure includes outputting EUV light generated using an EUV light generation apparatus including a target supply device to an exposure apparatus, and exposing a photosensitive substrate to the EUV light in the exposure apparatus to manufacture an electronic device. Here, the target supply device is configured to supply a liquid state target substance including tin to a concentration position of laser light to generate the EUV light and includes a tank configured to contain the target substance; and a nozzle communicating with an inside of the tank, and having a nozzle hole through which the target substance passes. An uneven structure is formed on a surface of the nozzle provided with the nozzle hole and facing the concentration position and exhibits tin repellency larger than tin repellency exhibited by a material of the surface.

An electronic device manufacturing method according to an aspect of the present disclosure includes inspecting a defect of a mask by irradiating the mask with EUV light generated using an EUV light generation apparatus including a target supply device, selecting a mask using a result of the inspection, and exposing and transferring a pattern formed on the selected mask onto a photosensitive substrate. Here, the target supply device is configured to supply a liquid state target substance including tin to a concentration position of laser light to generate the EUV light and includes a tank configured to contain the target substance; and a nozzle communicating with an inside of the tank, and having a nozzle hole through which the target substance passes. An uneven structure is formed on a surface of the nozzle provided with the nozzle hole and facing the concentration position and exhibits tin repellency larger than tin repellency exhibited by a material of the surface.

BRIEF DESCRIPTION OF THE DRAWINGS

Embodiments of the present disclosure will be described below merely as examples with reference to the accompanying drawings.

FIG. 20 is a table showing an example of conditions under which the uneven structure exhibits tin repellency.

DESCRIPTION OF EMBODIMENTS

Figure 1:
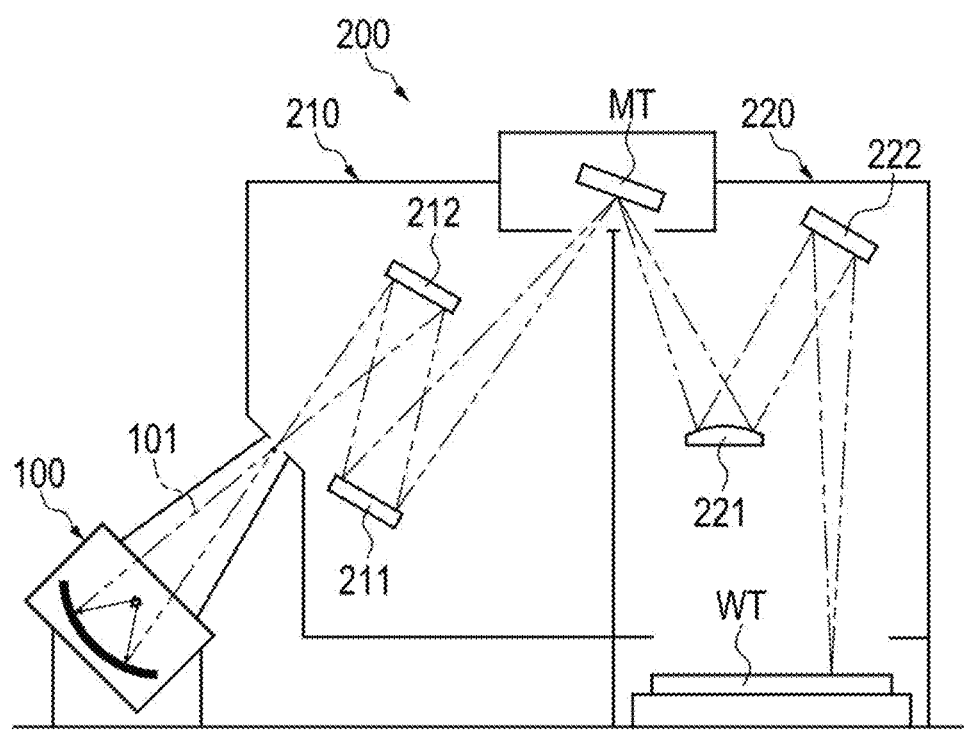
FIG. 1 is a schematic view showing a configuration example of an electronic device manufacturing apparatus.

<Contents>
1. Overview
2. Electronic device manufacturing method
3. EUV light generation apparatus according to comparative example
   3.1 Configuration and operation
   3.2 Problem
4. EUV light generation apparatus according to first embodiment
   4.1 Configuration and operation
   4.2 Effect
5. EUV light generation apparatus according to second embodiment
   5.1 Configuration and operation
   5.2 Effect
6. Uneven structure
   6.1 Condition
   6.2 Modification Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Overview

The present disclosure relates to a target supply device used for an EUV light generation apparatus and an electronic device manufacturing apparatus.

2. Electronic Device Manufacturing Method

FIG. 1 shows a configuration example of the electronic device manufacturing apparatus. The electronic device manufacturing apparatus shown in FIG. 1 includes an EUV light generation apparatus 100 and an exposure apparatus 200. The exposure apparatus 200 includes a mask irradiation unit 210 including a plurality of mirrors 211, 212 that configure a reflection optical system, and a workpiece irradiation unit 220 including a plurality of mirrors 221, 222 that configure a reflection optical system different from the reflection optical system of the mask irradiation unit 210.

The mask irradiation unit 210 illuminates, via the mirrors 211, 212, a mask pattern of the mask table MT with EUV light 101 entering the EUV light generation apparatus 100. The workpiece irradiation unit 220 images the EUV light 101 reflected by the mask table MT onto a workpiece (not shown) placed on the workpiece table WT via the mirrors 211, 212. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure steps as described above, a device pattern is transferred onto the semiconductor wafer, thereby a semiconductor device can be manufactured.

Figure 2:
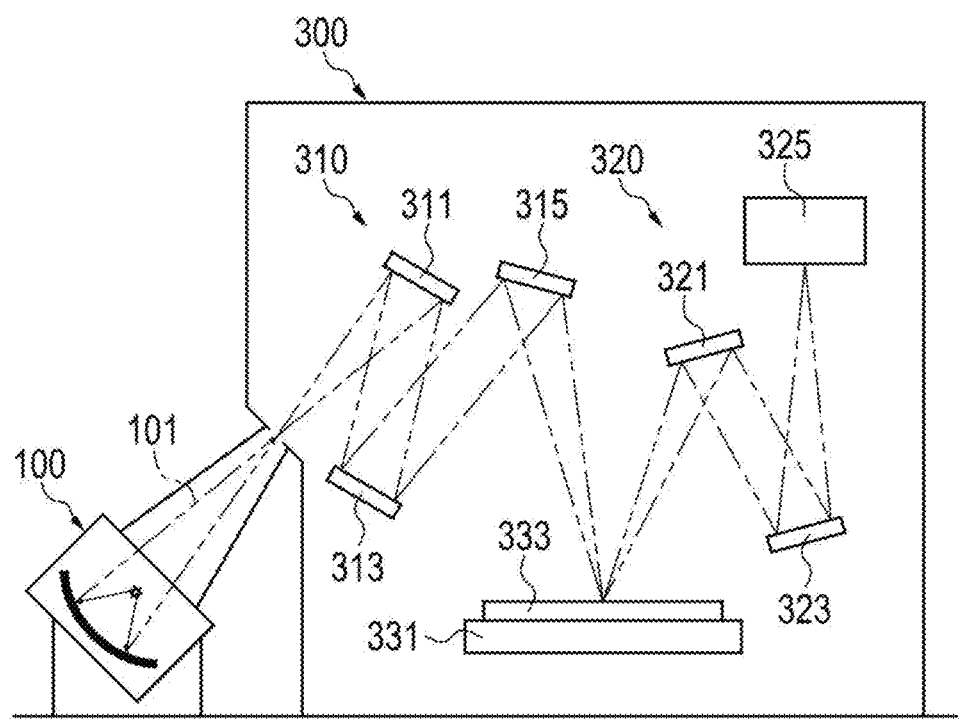
FIG. 2 is a schematic view showing a configuration example of an entire electronic device manufacturing apparatus different from the electronic device manufacturing apparatus shown in FIG. 1.

FIG. 2 shows a configuration example of an electronic device manufacturing apparatus different from the electronic device manufacturing apparatus shown in FIG. 1. The electronic device manufacturing apparatus shown in FIG. 2 includes the EUV light generation apparatus 100 and an inspection apparatus 300. The inspection apparatus 300 includes an illumination optical system 310 including a plurality of mirrors 311, 313, 315 that configure a reflection optical system, and a detection optical system 320 including a detector 325 and a plurality of mirrors 321, 322 that configure a reflection optical system different from the reflection optical system of the illumination optical system 310.

The illumination optical system 310 reflects, with the mirrors 311, 313, 315, the EUV light 101 entering from the EUV light generation apparatus 100 to illuminate a mask 333 placed on a mask stage 331. The mask 333 includes a mask blanks before a pattern is formed. The detection optical system 320 reflects, with the mirrors 321, 323, the EUV light 101 reflecting the pattern from the mask 333 and forms an image on a light receiving surface of the detector 325. The detector 325 having received the EUV light 101 obtains an image of the mask 333. The detector 325 is, for example, a time delay integration (TDI) camera. Inspection for a defect of the mask 333 is performed based on the image of the mask 333 obtained by the above-described steps, and a mask suitable for manufacturing an electronic device is selected using the inspection result. Then, the electronic device can be manufactured by exposing and transferring the pattern formed on the selected mask onto the photosensitive substrate using the exposure apparatus 200.

3. EUV Light Generation Apparatus According to Comparative Example 3.1 Configuration and Operation The following description will be given with reference to the EUV light generation apparatus 100 that outputs the EUV light 101 to the exposure apparatus 200 as an external apparatus as shown in FIG. 1. The same applies to the EUV light generation apparatus 100 that outputs the EUV light 101 toward the inspection apparatus 300 as an external apparatus as shown in FIG. 2. In the present disclosure, the vertical direction is defined as a Z direction, one direction orthogonal to the Z direction is defined as an X direction, and a direction orthogonal to the Z direction and the X direction is defined as a Y direction.

Figure 3:
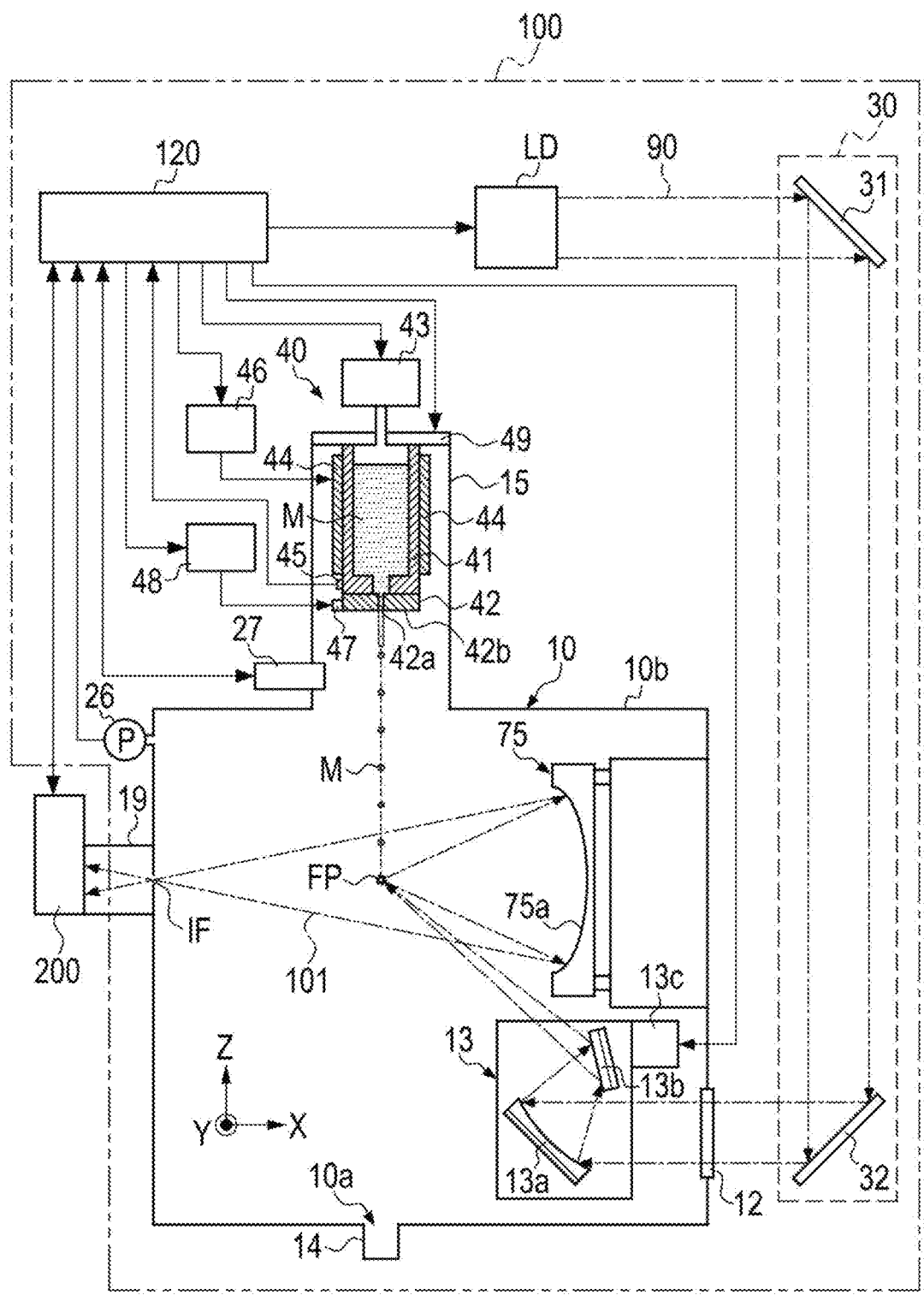
FIG. 3 is a schematic view showing the configuration of an EUV light generation apparatus according to a comparative example.

FIG. 3 shows the configuration of the EUV light generation apparatus 100 according to a comparative example. As shown in FIG. 3, the EUV light generation apparatus 100 includes a chamber 10, a laser device LD, a processor 120, and a laser light delivery optical system 30 as a main configuration.

The chamber 10 is a sealable container. The chamber 10 includes an inner wall 10b surrounding the internal space having a low pressure atmosphere. The chamber 10 includes a sub-chamber 15, and a target supply device 40 is attached to the sub-chamber 15 via a stage mechanism 49, which will be described later, to penetrate a wall of the sub-chamber 15. The target supply device 40 includes a tank 41, a nozzle 42, and a pressure regulator 43, and supplies a target substance M to the internal space of the chamber 10.

The tank 41 stores the target substance M containing tin (Sn) therein. The inside of the tank 41 is in communication with the pressure regulator 43 which adjusts the pressure in the tank 41. A heater 44 and a temperature sensor 45 are attached to the tank 41. The heater 44 heats the tank 41 with current applied from a heater power source 46. Through the heating, the target substance M in the tank 41 melts. The temperature sensor 45 measures, via the tank 41, the temperature of the target substance M in the tank 41. The pressure regulator 43, the temperature sensor 45, and the heater power source 46 are electrically connected to the processor 120.

The nozzle 42 is attached to the tank 41. The nozzle 42 has a nozzle hole 42a which is a through hole in communication with the inside of the tanks 41 and through which the target substance M in a liquid state passes. A surface 42b of the nozzle 42 is provided with the nozzle hole 42a and faces a concentration position FP of laser light 90 to be described later. The surface 42b of the nozzle 42 is parallel to the X direction and the Y direction, and has a circular shape centered on the nozzle hole 42a when viewed in a plan view from the Z direction. For example, the diameter of the surface 42b of the nozzle 42 is 20 mm, and the diameter of the nozzle hole 42a is 3 μm.

The nozzle 42 outputs the target substance M in a jet form from the nozzle hole 42a. A piezoelectric element 47 is attached to the nozzle 42. The piezoelectric element 47 is electrically connected to a piezoelectric power source 48 and is driven by a voltage applied from the piezoelectric power source 48 to vibrate. The piezoelectric power source 48 is electrically connected to the processor 120. Due to the vibration of the piezoelectric element 47, the jet-form target substance M output from the nozzle hole 42a changes into droplet-shaped target substances M each having a predetermined diameter, and falls toward the concentration position FP. The trajectory of the target substance M falling from the nozzle hole 42a toward the concentration position FP is a straight line parallel to the Z direction.

The chamber 10 includes a target collection unit 14. The target collection unit 14 is a box body attached to an inner wall 10b of the chamber 10 and communicates with the internal space of the chamber 10 via an opening 10a formed at the inner wall 10b of the chamber 10. The opening 10a is provided directly below the nozzle 42. The target collection unit 14 is a drain tank to collect any unnecessary target substance M having passed through the opening 10a and reaching the target collection unit 14.

As a material of the nozzle 42, metal, ceramic, glass, or the like can be selected. In particular, when the target substance M contains tin and a metal is selected as the material of the nozzle 42, molybdenum, tungsten, or the like is preferably selected so as to withstand the melting temperature of the target substance M and corrosion.

The sub-chamber 15 is provided with a stage mechanism 49 for holding the tank 41 to be movable in the horizontal direction. The stage mechanism 49 has a function of moving the position of the nozzle 42 in the XY plane to correct the positional deviation of the trajectory of the target substance M from the concentration position FP of the laser light 90 to be described later.

At least one through hole is formed in the inner wall 10b of the chamber 10. The through hole is blocked by a window 12 through which the pulse laser light 90 output from the laser device LD is transmitted.

Further, a laser light concentrating optical system 13 is provided at the internal space of the chamber 10. The laser light concentrating optical system 13 includes a laser light concentrating mirror 13a and a high reflection mirror 13b. The laser light concentrating mirror 13a reflects and concentrates the laser light 90 having transmitted through the window 12. The high reflection mirror 13b reflects the laser light 90 concentrated by the laser light concentrating mirror 13a. Positions of the laser light concentrating mirror 13a and the high reflection mirror 13b are adjusted by a laser light manipulator 13c so that the concentration position FP of the laser light 90 at the internal space of the chamber 10 coincides with a position specified by the processor 120. The concentration position FP is adjusted to be positioned directly below the nozzle hole 42a of the nozzle 42.

When the droplet-shaped target substance M is irradiated with the laser light 90 at the concentration position FP, plasma is generated and the EUV light 101 is emitted from the plasma. At this time, a part of the target substance M is scattered as tin particles and is deposited on the components in the chamber 10 such as the surface 42b of the nozzle 42.

For example, an EUV light concentrating mirror 75 having a spheroidal reflection surface 75a is provided at the internal space of the chamber 10. The EUV light concentrating mirror 75 is arranged at a position not overlapping the optical path of the laser light 90 at the internal space of the chamber 10. The reflection surface 75a reflects the EUV light 101 radiated from the plasma at the concentration position FP. The reflection surface 75a has a first focal point and a second focal point. The reflection surface 75a is arranged such that, for example, the first focal point is located at the concentration position FP and the second focal point is located at an intermediate focal point IF.

Further, the EUV light generation apparatus 100 includes a connection portion 19 providing communication between the internal space of the chamber 10 and the internal space of the exposure apparatus 200. A wall in which an aperture is formed is arranged in the connection portion 19. The wall is preferably arranged such that the aperture is located at the second focal point. The connection portion 19 is the emission port of the EUV light 101 in the EUV light generation apparatus 100. The EUV light 101 is output from the connection portion 19 to the outside of the EUV light generation apparatus 100 and enters the exposure apparatus 200.

Further, the EUV light generation apparatus 100 includes a pressure sensor 26, and a detection unit 27 as a target sensor. The pressure sensor 26 and the detection unit 27 are attached to the chamber 10 and are electrically connected to the processor 120. The pressure sensor 26 measures the pressure at the internal space of the chamber 10 and outputs a signal indicating the measured pressure to the processor 120.

The detection unit 27 has, for example, an imaging function, and detects the presence, trajectory, position, velocity, and the like of the target substance M output from the nozzle 42 in accordance with an instruction from the processor 120. The detection unit 27 may be arranged inside the chamber 10, or may be arranged outside the chamber 10 and detect the target substance M through a window (not shown) arranged on a wall of the chamber 10. The detection unit 27 includes a light receiving optical system (not shown) and an imaging unit (not shown) such as a charge-coupled device (CCD) and a photodiode. In order to improve the detection accuracy of the target substance M, the light receiving optical system forms an image of the trajectory of the target substance M and the periphery thereof on a light receiving surface of the imaging unit.

A light source (not shown) is arranged to improve the contrast in the field of view of the detection unit 27. When the target substance M passes through the concentration region of the light by the light source, the imaging unit detects a change in the light passing through the trajectory of the target substance M and the periphery thereof. The imaging unit converts the detected light change into image data of the target substance M. The imaging unit outputs the electric signal to the processor 120.

The laser device LD includes a master oscillator that performs burst operation. The master oscillator outputs the pulse laser light 90 in a burst-on duration. The master oscillator is, for example, a laser device configured to output the laser light 90 by exciting, through electric discharge, a gas as mixture of a carbon dioxide gas with helium, nitrogen, or the like. The master oscillator may be a quantum cascade laser device. Further, the master oscillator may output the pulse laser light 90 by a Q switch system. Further, the master oscillator may include an optical switch, a polarizer, and the like. In the burst operation, the pulse laser light 90 is continuously output at a predetermined repetition frequency in the burst-on duration and the output of the laser light 90 is stopped in a burst-off duration.

A travel direction of the laser light 90 output from the laser device LD is adjusted by the laser light delivery optical system 30. The laser light delivery optical system 30 includes a plurality of mirrors 31, 32 for adjusting the travel direction of the laser light 90. The position of at least one of the mirrors 31, 32 is adjusted by an actuator (not shown). Owing to that the position of at least one of the mirrors 31, 32 is adjusted, the laser light 90 can appropriately propagate to the internal space of the chamber 10 through the window 12.

The processor 120 is a processing device including a storage device in which a control program is stored and a central processing unit (CPU) that executes the control program. The processor 120 is specifically configured or programmed to perform various processes included in the present disclosure and controls the entire EUV light generation apparatus 100. The processor 120 receives a signal related to the pressure at the internal space of the chamber 10, which is measured by the pressure sensor 26, the image data of the target substance M captured by the detection unit 27, a burst signal instructing the burst operation from the exposure apparatus 200, and the like. The processor 120 processes the various signals and controls, for example, the timing at which the target substance M is output. Further, the processor 120 controls the output direction of the target substance M by the stage mechanism 49. Further, the processor 120 controls the output timing of the laser device LD, the travel direction of the laser light 90, the concentration position FP, and the like.

3.2 Problem

Figure 4:
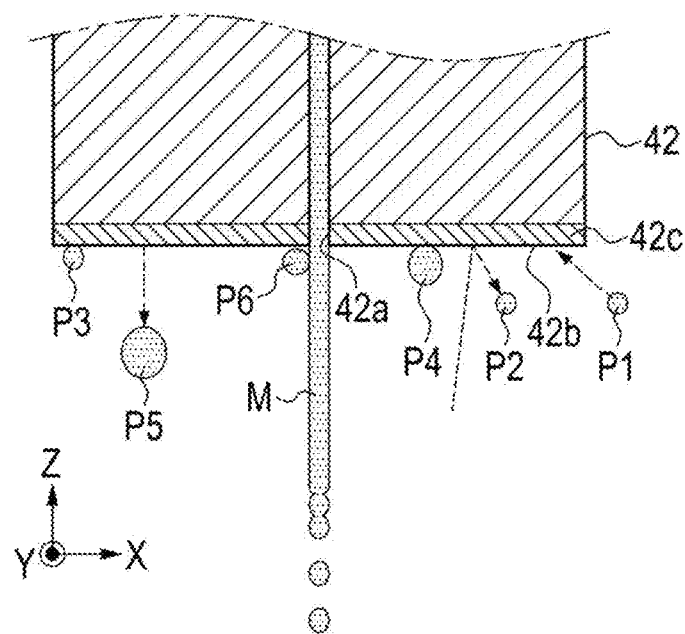
FIG. 4 is a sectional view showing a state of a nozzle in an initial state immediately after the operation of an EUV light generation apparatus starts.

FIG. 4 shows a state of the nozzle 42 in an initial state immediately after the operation of the EUV light generation apparatus 100 starts. FIG. 4 shows a case in which a metal such as molybdenum or tungsten is selected as the material of the nozzle 42. In this case, an oxide film 42c is formed on the surface 42b of the nozzle 42. The oxide film 42c is a natural oxide film formed by oxidation of the surface 42b of the nozzle 42 due to reaction with oxygen in the atmosphere to alter. When the material of the nozzle 42 is molybdenum, the oxide film 42c is molybdenum oxide. When the material of the nozzle 42 is tungsten, the oxide film 42c is tungsten oxide. The oxide film 42c exhibits larger tin repellency than the metal that is the material of the nozzle 42. Tin repellency refers to the property of repelling tin. In the present comparative example, the surface 42b of the nozzle 42 is a flat plane without unevenness.

When alumina, quartz, or the like is selected as the material of the nozzle 42, since these materials themselves are oxides, the surface 42b of the nozzle 42 does not react with oxygen in the atmosphere and is not altered, but exhibits tin repellency.

A part of the target substances M irradiated with the laser light 90 at the internal space of the chamber 10 flies toward the surface 42b of the nozzle 42 as tin particles. In a state in which the surface 42b of the nozzle 42 is altered to the oxide film 42c, the flying tin particles collide with the surface 42b of the nozzle 42 and many thereof bounce back due to tin repellency toward the internal space of the chamber 10. In FIG. 4, P1 indicates a tin particle flying toward the surface 42b of the nozzle 42. P2 indicates a tin particle bounced off the surface 42b of the nozzle 42.

However, some of the tin particles that have collided with the surface 42b of the nozzle 42 adhere to and remain on the surface 42b. P3 indicates a tin particle immediately after adhering to the surface 42b of the nozzle 42. A tin particle adhering to the surface 42b of the nozzle 42 is increased in volume by coalescing with other tin particles adhering to the surface 42b or absorbing the flying tin particles. Hereinafter, the increase in volume is referred to as growth. P4 indicates a grown tin particle. A grown tin particle eventually falls by the own weight. P5 indicates a grown and falling tin particle.

In addition, the tin particles adhering to the vicinity of the nozzle hole 42a on the surface 42b of the nozzle 42 may be absorbed by contacting with the jet-form target substance M output from the nozzle hole 42a by increasing in volume. P6 indicates a tin particle that is absorbed by contacting with the target substance M in the vicinity of the nozzle hole 42a.

Figure 5:
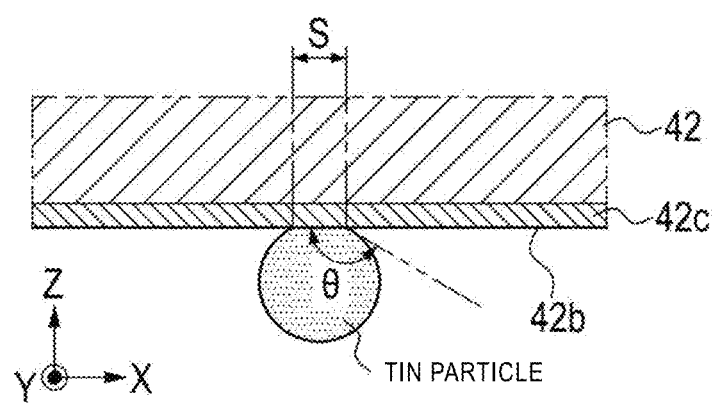
FIG. 5 is an enlarged sectional view of the nozzle showing a state in which a tin particle adheres to the surface in the initial state.

As shown in FIG. 5, a tin particle adhering to the surface 42b of the nozzle 42 in the initial state has a large contact angle $\theta$ with the surface 42b and a small contact area S with the surface 42b due to tin repellency. Therefore, a tin particle adhering to the surface 42b falls by the own weight before growing and becoming large. Here, "becoming large" means that the volume of the tin particle becomes equal to or larger than a certain value.

For example, the contact angle $\theta$ varies depending on the material of the surface 42b as follows. In a case of molybdenum oxide, $\theta=143°$. In a case of tungsten oxide, $\theta=150°$. In a case of alumina, $\theta=163°$. In a case of quartz, $\theta=123°$ to 150°.

As described above, in the initial state, even when tin particles adhere to the surface 42b of the nozzle 42 and grow, the tin particles fall by their own weight before becoming large, or are absorbed by contacting with the target substance M output from the nozzle hole 42a before becoming large. At this time, since the volume of the tin particles absorbed by the target substance M is small, the trajectory of the target substance M is not disturbed by the absorption of the tin particles.

Figure 6:
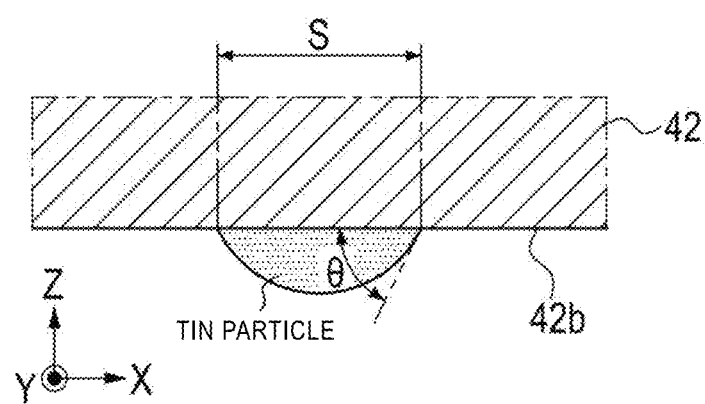
FIG. 6 is an enlarged sectional view of the nozzle showing a state in which a tin particle adheres to the surface after a certain operation time has elapsed.

However, the tin particles adhering to the oxide film 42c have an effect of reducing the oxide film 42c. Therefore, as the operation time of the EUV light generation apparatus 100 elapses, the material itself on the surface 42b of the nozzle 42 changes to an exposed state, and eventually the surface 42b becomes a state in which the oxide film 42c disappears as shown in FIG. 6. When the oxide film 42c disappears from the surface 42b, tin repellency decreases. As a result, the contact angle θ decreases and the contact area S increases.

Even when the material of the nozzle 42 is alumina, quartz, or the like, and the surface 42b exhibits tin repellency due to the material itself, the surface 42b deteriorates with the lapse of operation time, and thus tin repellency decreases.

As described above, when tin repellency of the surface 42b of the nozzle 42 decreases, for example, the trajectory of the target substance M is disturbed through first to fourth periods shown in FIGS. 7 to 10, resulting in that the target substance M cannot be irradiated with the laser light 90.

Figure 7:
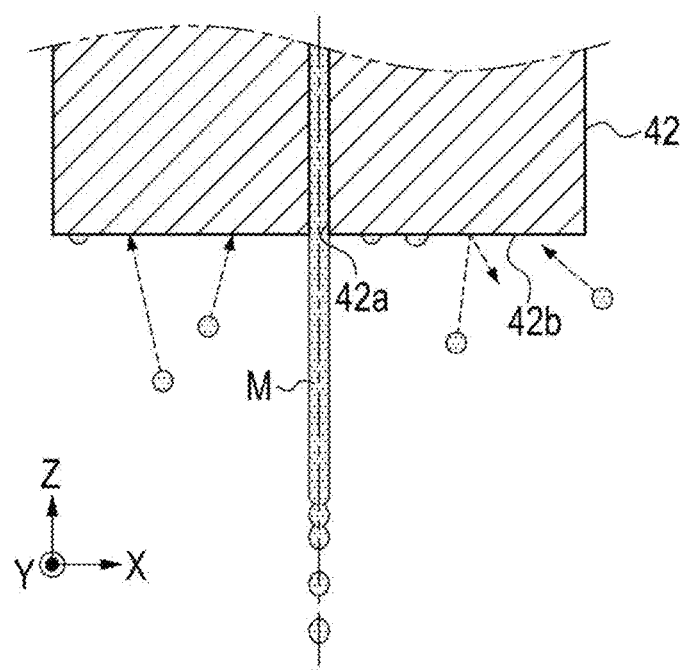
FIG. 7 is a sectional view showing a state of the nozzle in a first period immediately after tin repellency of the surface has decreased.

FIG. 7 shows the state of the nozzle 42 in the first period immediately after tin repellency of the surface 42b has decreased. As shown in FIG. 7, in the first period, tin particles flying from the internal space of the chamber 10 begin to adhere to the surface 42b. At this time, since tin repellency of the surface 42b has decreased, the tin particles easily adhere thereto. In the first period, the volume of the tin particles adhering to the surface 42b is small, and therefore, even when the target substance M absorbs the tin particles, the trajectory of the target substance M is not disturbed.

Figure 8:
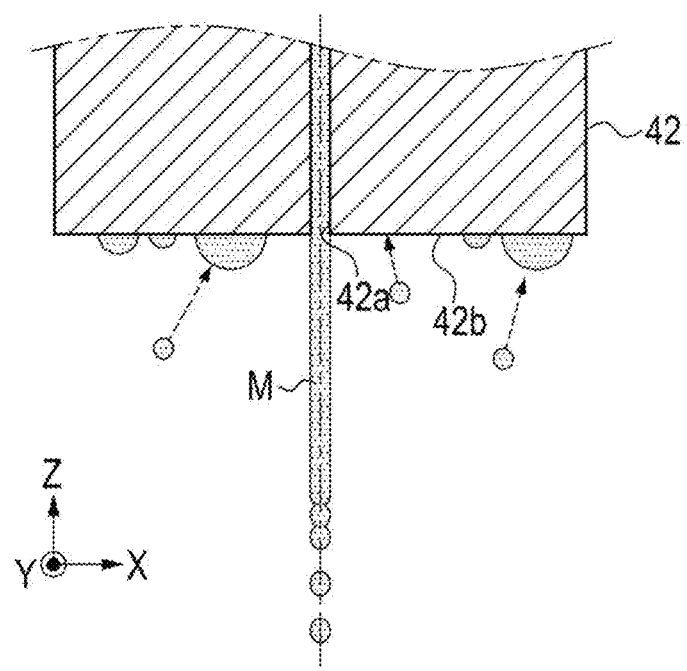
FIG. 8 is a sectional view showing a state of the nozzle in a second period after the first period.

FIG. 8 shows the state of the nozzle 42 in the second period after the first period. As shown in FIG. 8, in the second period, the tin particles adhering to the surface 42b begin to grow by coalescing with other tin particles adhering to the surface 42b or absorbing the tin particles flying thereto. Since tin repellency of the surface 42b has decreased, the tin particles adhering to the surface 42b are unlikely to fall and easily grow.

Figure 9:
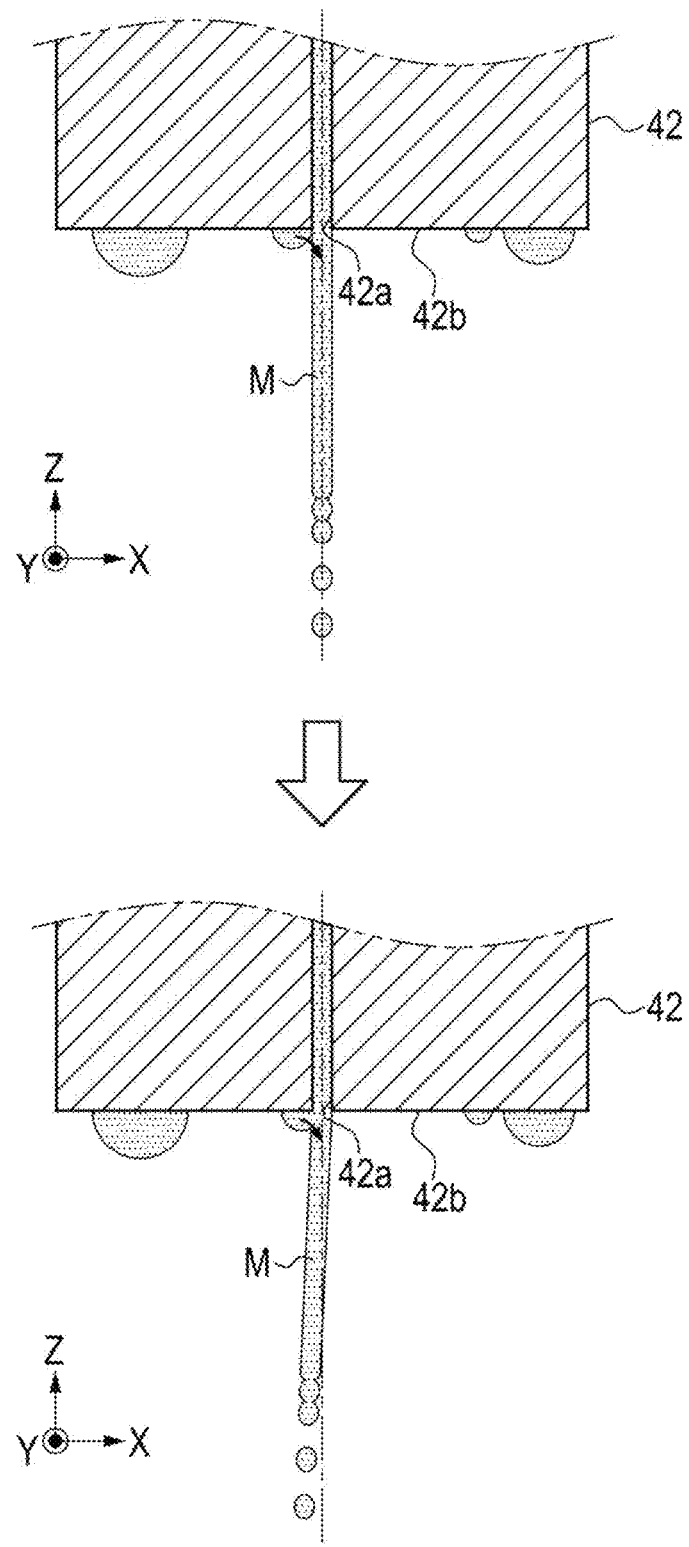
FIG. 9 is a sectional view showing a state of the nozzle in a third period after the second period.

FIG. 9 shows the state of the nozzle 42 in the third period after the second period. As shown in FIG. 9, in the third period, the tin particles adhering to and growing in the vicinity of the nozzle hole 42a on the surface 42b are absorbed by contacting with the target substance M output from the nozzle hole 42a. When the target substance M absorbs the tin particles, the trajectory of the target substance M may be inclined by being pulled by the tin particles. However, in the third period, since the growth of the tin particles is not advanced so much, the amount of inclination is small, and the time period of inclination is also short. In the third period, since the amount of inclination is small, the trajectory of the target substance M can be corrected by the stage mechanism 49. However, in the third period, the tin particles continue to grow and become large in a region of the surface 42b away from the nozzle hole 42a.

Figure 10:
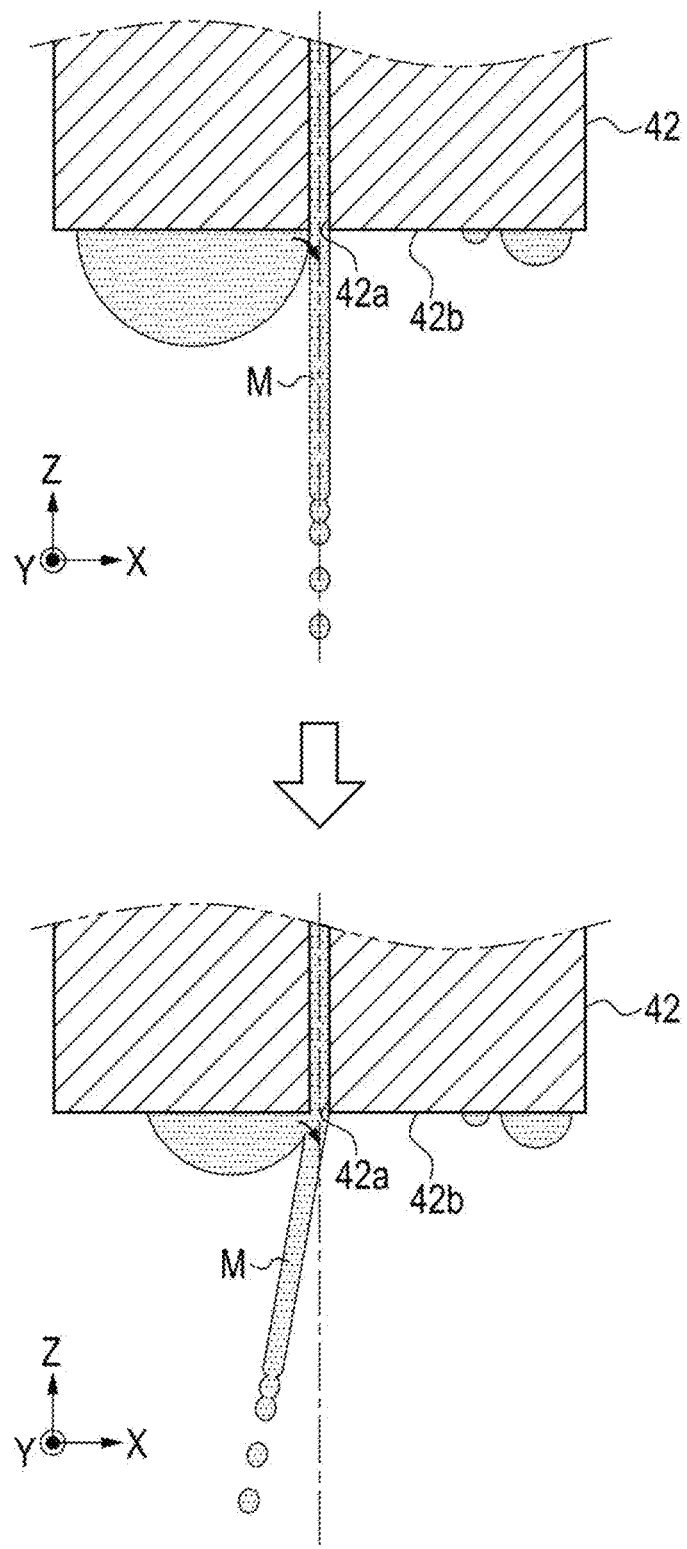
FIG. 10 is a sectional view showing a state of the nozzle in a fourth period after the third period.

FIG. 10 shows the state of the nozzle 42 in the fourth period after the third period. As shown in FIG. 10, in the fourth period, the end part of the tin particles that have become large in a region away from the nozzle hole 42a approaches the nozzle hole 42a. The end part of the tin particles contacts with the target substance M output from the nozzle hole 42a, and the tin particles begin to be absorbed by the target substance M. Since the time period until the tin particles that have become large are absorbed by the target substance M to disappear becomes longer than that in the third period, the trajectory of the target substance M is largely inclined. That is, in the fourth period, since the amount of inclination is large and the time period of inclination is also long, it is difficult to correct the trajectory of the target substance M by the stage mechanism 49.

As described above, in the EUV light generation apparatus 100 according to the comparative example, tin repellency of the surface 42b decreases as the operation time elapses, and the trajectory of the target substance M is greatly disturbed, resulting in that the target substance M cannot be supplied to the concentration position FP of the laser light 90. As a result, the target substance M cannot be irradiated with the laser light 90, and the generation of the EUV light 101 by the EUV light generation apparatus 100 is stopped. When the generation of the EUV light 101 is stopped, it may be necessary to stop the operation of the EUV light generation apparatus 100 and replace the target supply device 40.

4. EUV Light Generation Apparatus According to First Embodiment

The EUV light generation apparatus 100 according to a first embodiment will be described. The configuration of the EUV light generating apparatus 100 according to the first embodiment is similar to that of the EUV light generation apparatus 100 according to the comparative example except that the configuration of the nozzle 42 of the target supply device 40 is different. Any component same as that described above is denoted by an identical reference sign, and duplicate description thereof is omitted unless specific description is needed.

4.1 Configuration and Operation

Figure 11:
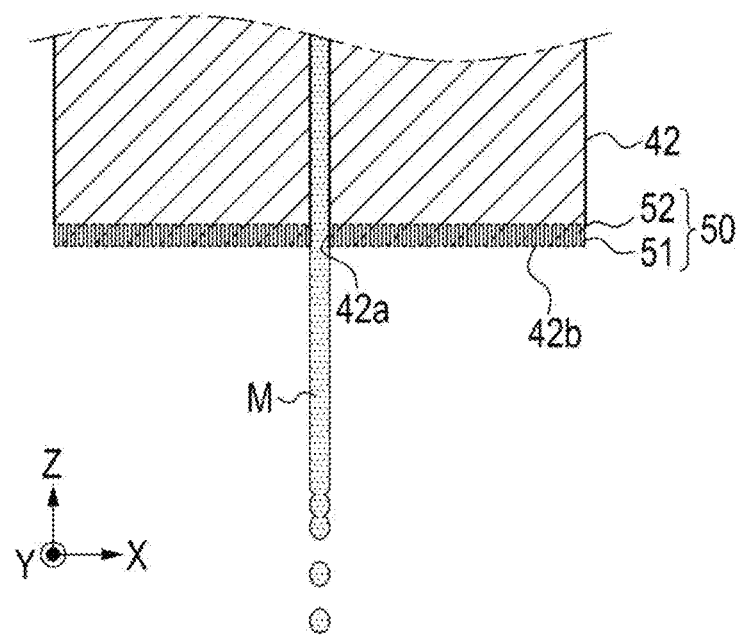
FIG. 11 is a sectional view showing the configuration of the nozzle included in a target supply device according to a first embodiment.

FIG. 11 shows the configuration of the nozzle 42 included in the target supply device 40 according to the first embodiment. In the present embodiment, an uneven structure 50 that exhibits tin repellency larger than tin repellency exhibited by the material of the surface 42b is formed on the surface 42b of the nozzle 42.

For example, the material of the nozzle 42 is any one of molybdenum, tungsten, alumina, and quartz. Here, when the material of the nozzle 42 is molybdenum, the material of the surface 42b is molybdenum oxide. When the material of the nozzle 42 is tungsten, the material of the surface 42b is tungsten oxide. When the material of the nozzle 42 is alumina, the material of the surface 42b is alumina. When the material of the nozzle 42 is quartz, the material of the surface 42b is quartz.

The uneven structure 50 has a plurality of convex portions 51 and a plurality of concave portions 52, and the concave portions 52 are arranged at a predetermined arrangement pitch in at least one direction. The uneven structure 50 is provided in a region surrounding the nozzle hole 42a. In the present embodiment, the uneven structure 50 is formed on the entire surface 42b.

For example, the uneven structure 50 is formed by performing laser processing on the surface 42b by a pulse laser device. The groove formed by the laser processing becomes the concave portion 52, and the gap between two grooves becomes the convex portion 51. Not limited to laser processing, the uneven structure 50 can be formed using a technique such as lithography or nanoimprinting. Here, the uneven structure 50 may be formed using two or more of laser processing, lithography, and nanoimprinting.

Figure 12:
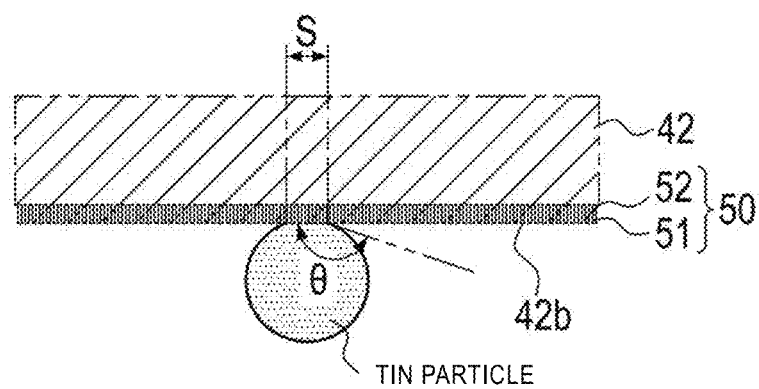
FIG. 12 is an enlarged sectional view of the nozzle for explaining tin repellency of the surface of the nozzle according to the first embodiment.

FIG. 12 explains tin repellency of the surface 42b of the nozzle 42 according to the first embodiment. As shown in FIG. 12, in the present embodiment, since the surface 42b has large tin repellency due to the uneven structure 50, tin particles adhering to the surface 42b are substantially spherical, the contact angle θ is large, and the contact area S is small. In the present embodiment, since the uneven structure 50 is formed on the surface 42b, the contact angle θ is larger and the contact area S is smaller than when the surface 42b is flat and altered to the oxide film 42c as in the comparative example shown in FIG. 5.

Figure 13:
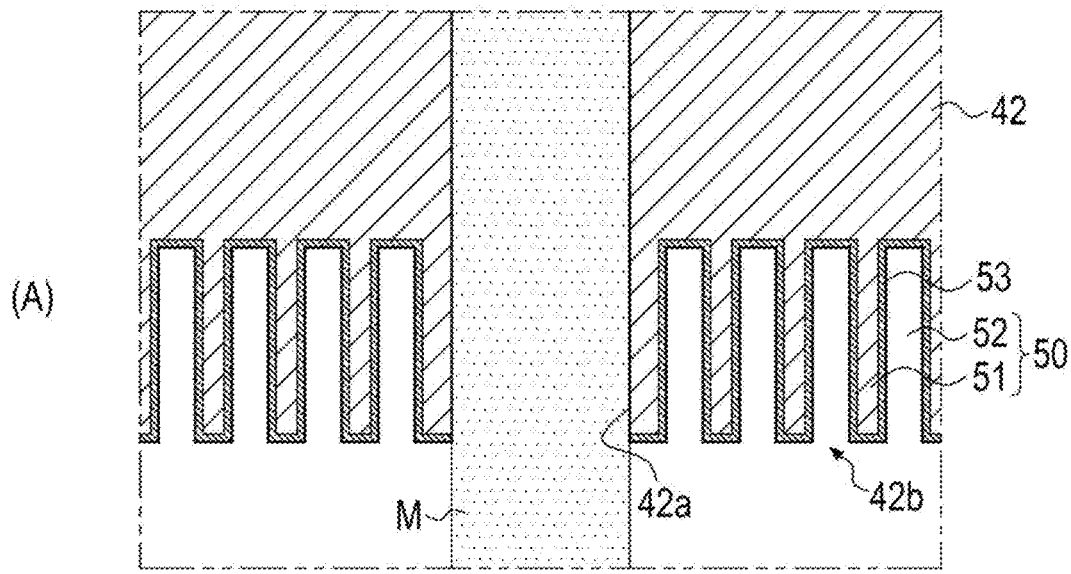
FIG. 13 is an enlarged sectional view showing a change in the state of an uneven structure when the material of the nozzle is a metal such as molybdenum or tungsten.
Figure 13:
Figure 13:
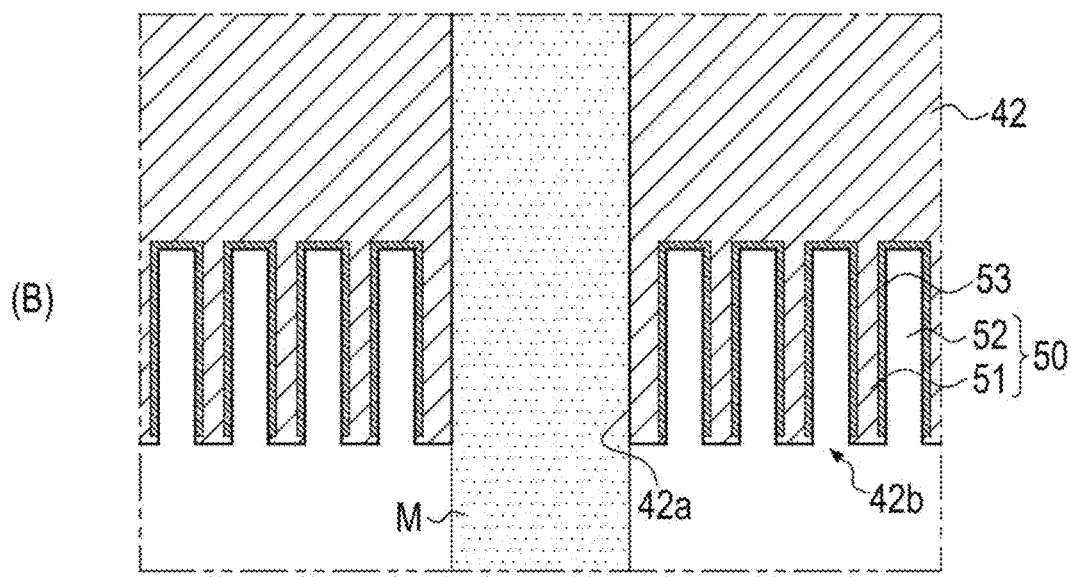

FIG. 13 shows a change in the state of the uneven structure 50 when the material of the nozzle 42 is a metal such as molybdenum or tungsten. (A) shows an initial state immediately after the operation of the EUV light generation apparatus 100 starts. (B) shows the state after the operation with a certain period of elapsed time. As shown in (A), in the initial state, the oxide film 53 is present on the surface of the uneven structure 50. The oxide film 53 is a natural oxide film formed by oxidation of the surface of the uneven structure 50 due to reaction with oxygen in the atmosphere to alter. As shown in (B), after the operation with a certain period of elapsed time, for example, the oxide film 53 on the top surfaces of the convex portions 51 is reduced to disappear. However, even when the oxide film 53 on the top surfaces of the convex portions 51 disappears, since the uneven structure 50 remains as it is, tin repellency continues to be exhibited even when the operation time is prolonged.

4.2 Effect

In the comparative example, tin repellency of the surface 42b of the nozzle 42 is exhibited by the material of the surface 42b, but in the present embodiment, tin repellency is exhibited by the uneven structure 50. Therefore, in the present embodiment, decrease in tin repellency with the lapse of the operation time is suppressed, and tin repellency larger than tin repellency exhibited by the material of the surface 42b is exhibited for a long time period.

Figure 14:
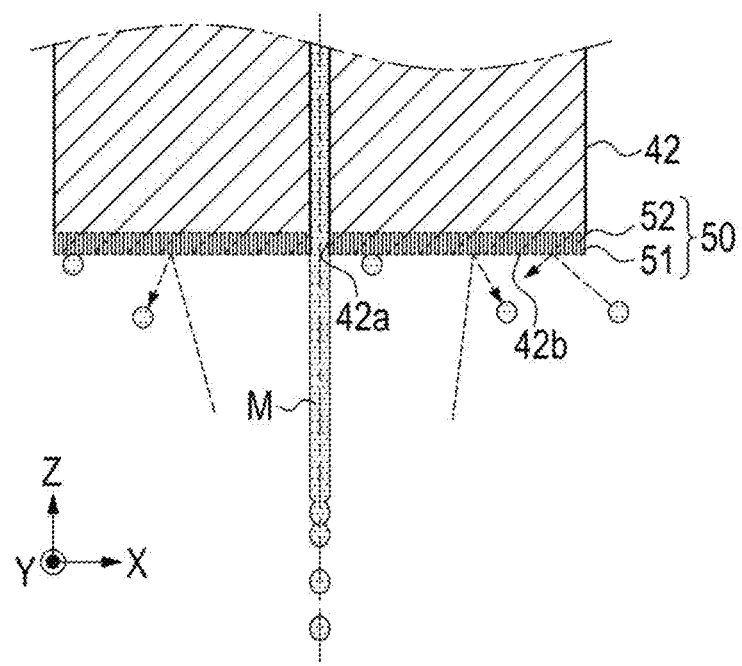
FIG. 14 is a sectional view showing how tin particles adhere to and grow on the surface of the nozzle according to the first embodiment.
Figure 15:
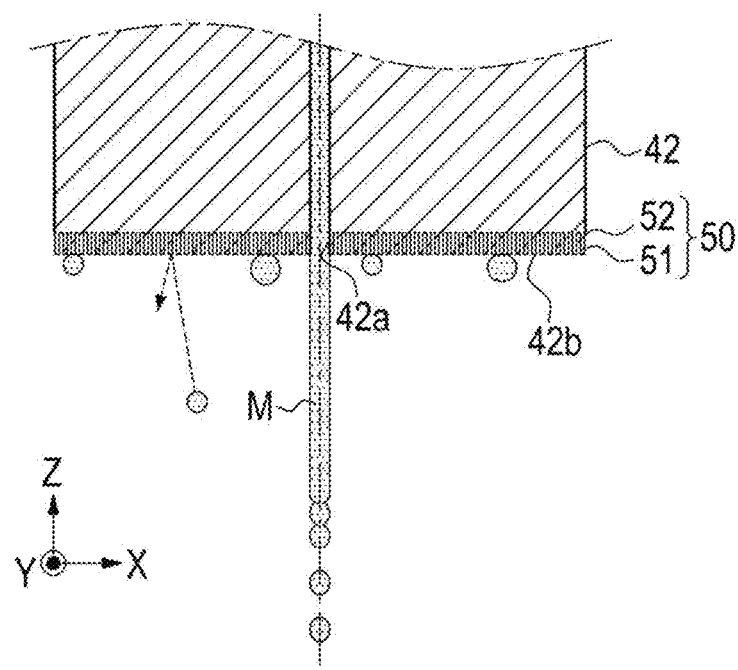
FIG. 15 is a sectional view showing how tin particles adhere to and grow on the surface of the nozzle according to the first embodiment.
Figure 16:
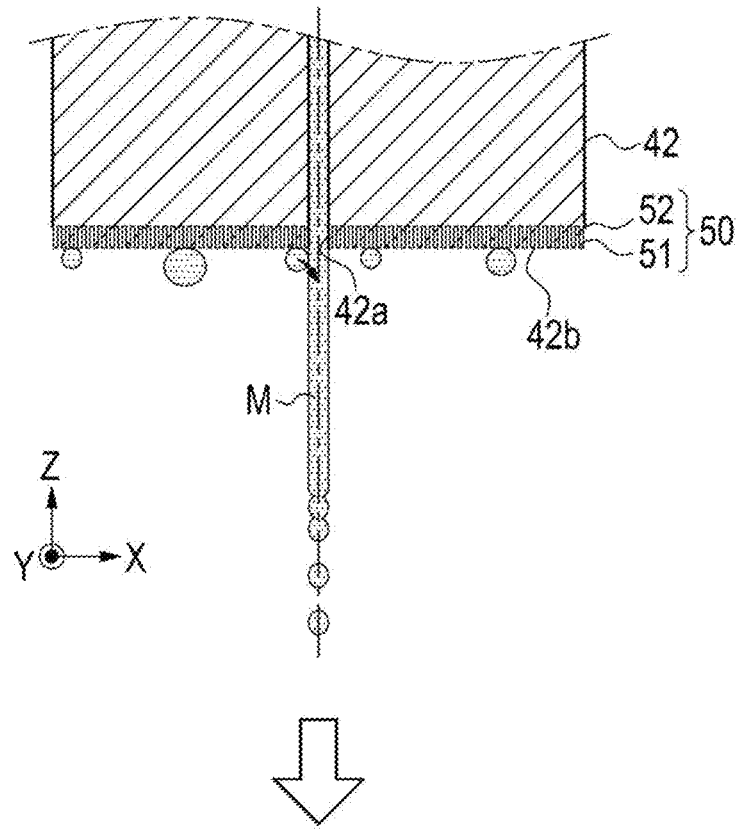
FIG. 16 is a sectional view showing how tin particles adhere to and grow on the surface of the nozzle according to the first embodiment.
Figure 16:
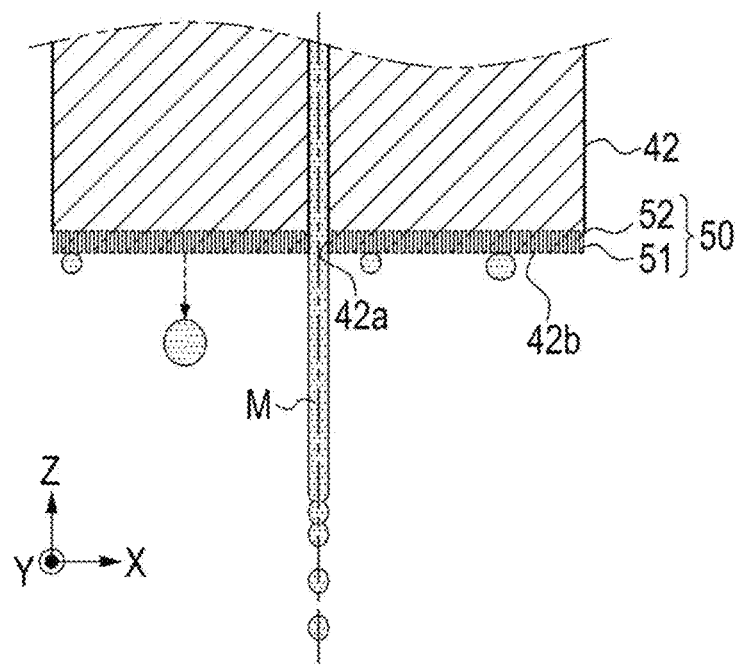

FIGS. 14 to 16 show how tin particles adhere to and grow on the surface 42b of the nozzle 42 according to the first embodiment. As shown in FIG. 14, at an early stage immediately after the operation starts, tin particles flying from the internal space of the chamber 10 are less likely to adhere to the surface 42b, but some of them adhere to the surface 42b. As shown in FIG. 15, tin particles adhering to the surface 42b grow by coalescing with other tin particles or by absorbing the tin particles flying thereto. As shown in FIG. 16, the tin particles growing in the vicinity of the nozzle hole 42a on the surface 42b are absorbed by the target substance M by contacting with the target substance M output from the nozzle hole 42a. Further, tin particles growing in a region of the surface 42b away from the nozzle hole 42a fall before becoming large due to tin repellency exhibited by the uneven structure 50.

As described above, in the present embodiment, the tin particles adhering to the surface 42b fall before becoming large or are absorbed by the target substance M before becoming large, and therefore, even when the target substance M absorbs the tin particles, the trajectory of the target substance M is not disturbed. Even when the trajectory of the target substance M is disturbed and inclined, the amount of inclination can be corrected by the stage mechanism 49. That is, in the present embodiment, since the supply of the target substance M to the concentration position FP of the laser light 90 by the target supply device 40 is stabilized, the timing when the replacement of the target supply device 40 is required is delayed. Thus, the life of the EUV light generation apparatus 100 is prolonged.

5. EUV Light Generation Apparatus According to Second Embodiment

The EUV light generation apparatus 100 according to a second embodiment will be described. The configuration of the EUV light generation apparatus 100 according to the second embodiment is similar to that of the EUV light generation apparatus 100 according to the first embodiment except that the configuration of the nozzle 42 of the target supply device 40 is different. Any component same as that described above is denoted by an identical reference sign, and duplicate description thereof is omitted unless specific description is needed.

5.1 Configuration and Operation

Figure 17:
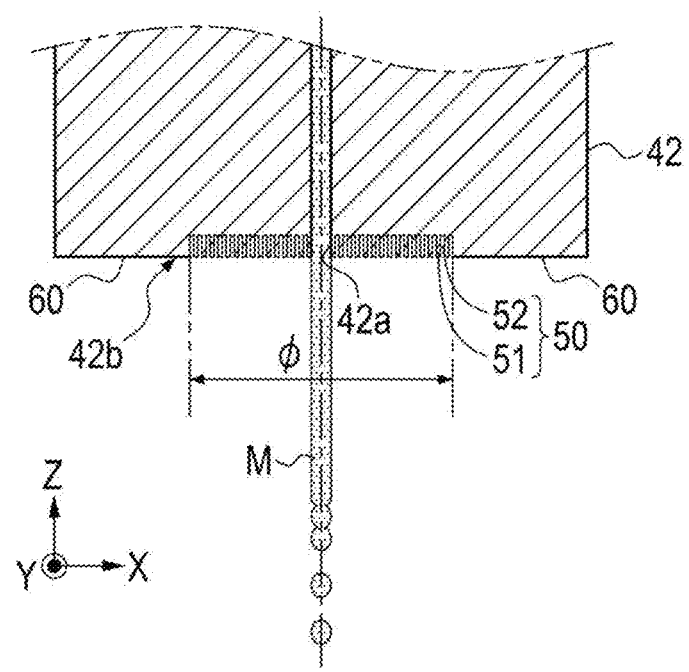
FIG. 17 is a sectional view showing the configuration of the nozzle included in the target supply device according to a second embodiment.

FIG. 17 shows the configuration of the nozzle 42 included in the target supply device 40 according to the second embodiment. In the present embodiment, the surface 42b of the nozzle 42 has, on the outside of the uneven structure 50, a flat region 60 having smaller tin repellency than the uneven structure 50.

In the present embodiment, on the surface 42b of the nozzle 42, the uneven structure 50 is provided in a region having a radius q around the nozzle hole 42a, and the flat region 60 is formed on the outside of the uneven structure 50. The uneven structure 50 has the configuration similar to that of the first embodiment. The flat region 60 is flush with the top surfaces of the convex portions 51 of the uneven structure 50. The flat region 60 is ring-shaped with the nozzle hole 42a as the center when viewed in plan view in the Z direction. For example, the radius q is in a range of 100 µm≤0≤1 mm.

Since tin repellency of the flat region 60 is exhibited by the material of the flat region 60, it is smaller than tin repellency of the uneven structure 50. Similarly to the first embodiment, the material of the nozzle 42 is any one of molybdenum, tungsten, alumina, and quartz. In this case, the material of the flat region 60 is any one of molybdenum oxide, tungsten oxide, alumina, and quartz.

5.2 Effect

As described in the first embodiment, even when the uneven structure 50 having large tin repellency is provided on the surface 42b of the nozzle 42, tin particles may adhere to the uneven structure 50 to grow, and thus it is not possible to completely suppress the tin particles from becoming large. Therefore, although the probability is low, the target substance M output from the nozzle hole 42a may contact with the tin particles that has adhered to the uneven structure 50 and has become large.

Figure 18:
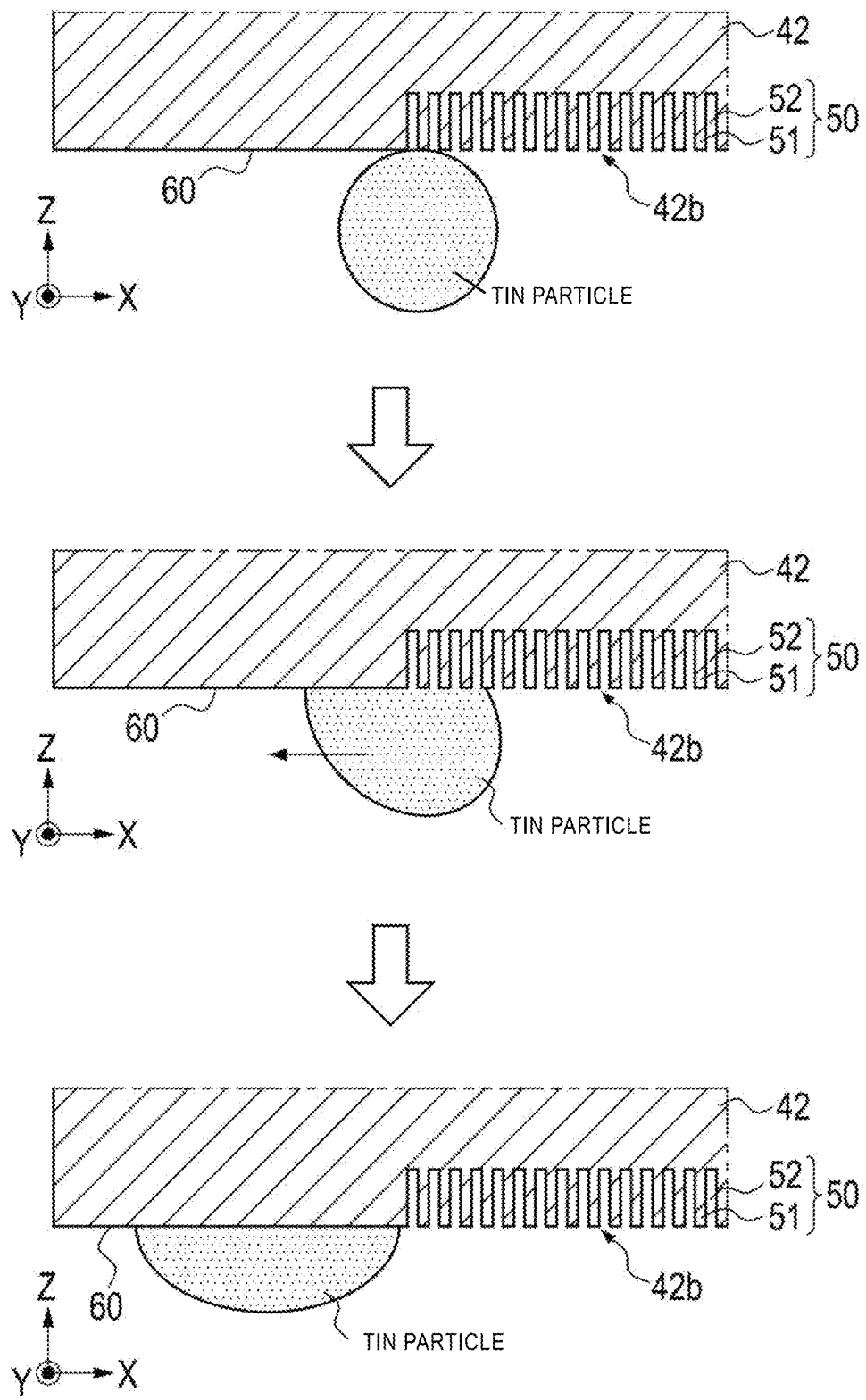
FIG. 18 is an enlarged sectional view of the nozzle showing how tin particles grown in the uneven structure move to a flat region.

As shown in FIG. 18, in the second embodiment, when the tin particles grown on the uneven structure 50 contact with the flat region 60 on the outside thereof, the tin particles move to the flat region 60 having low tin repellency due to the difference in tin repellency between the uneven structure 50 and the flat region 60. In other words, the tin particles move from the uneven structure 50 having a large contact angle θ to the flat region 60 having a small contact angle θ. Therefore, the tin particles grown in the uneven structure 50 contact with the flat region 60 before becoming large and move to the flat region 60 away from the nozzle hole 42a.

As described above, in the present embodiment, the tin particles at the peripheral region of the nozzle hole 42a are suppressed from becoming large as compared with the case in which the uneven structure 50 is provided on the entire surface 42b of the nozzle 42 as in the first embodiment. As a result, the probability that the tin particles that have become large contact with the target substance M output from the nozzle hole 42a is lowered, and the life of the EUV light generation apparatus 100 is further prolonged.

Further, when the flat region 60 is flush with the top surfaces of the convex portions 51 of the uneven structure 50, since there is no step that hinders the movement of the tin particles from the uneven structure 50 to the flat region 60, tin easily moves from the uneven structure 50 to the flat region 60. Thus, the tin particles at the peripheral region of the nozzle hole 42a are further suppressed from becoming large.

6. Uneven Structure
6.1 Condition

Figure 19:
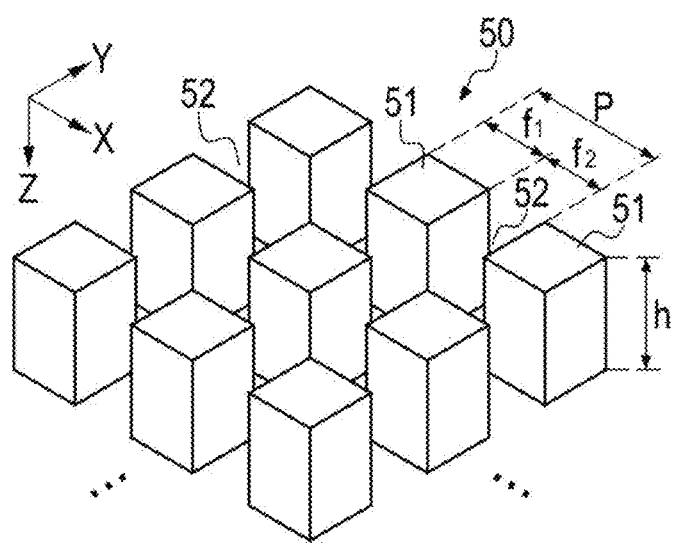
FIG. 19 is a perspective view showing a configuration example of the uneven structure.

Next, conditions related to tin repellency of the uneven structure 50 according to the first embodiment and the second embodiment will be described. FIG. 19 shows a configuration example of the uneven structure 50. As shown in FIG. 19, for example, the uneven structure 50 is configured by arranging the convex portions 51 of quadrangular prisms in the X direction and the Y direction.

Let D be an allowable maximum diameter, which is the diameter of the maximum tin particle that does not exceed a correction limit by the stage mechanism 49 even with contacting with the target substance M output from the nozzle hole 42a. In order to exhibit tin repellency to tin particles having the allowable maximum diameter D, it is preferable to satisfy the relationship of P/D<50. Here, P is an arrangement pitch of the convex portions 51 in the X direction.

Further, when the width of the convex portions 51 in the X direction is $f_1$ and the width of the concave portions 52 in the X direction is $f_2$, the ratio $f_1/f_2$ of the width $f_1$ of the convex portions 51 with respect to the width $f_2$ of the concave portions 52 is preferably in a range of $1 \leq f_1/f_2 \leq 2$. Here, the relationship of $P=f_1+f_2$ is satisfied.

Further, when the height of the convex portions 51 is h, it is preferable that the ratio r defined by $r=(2h+f_2)/f_2$ is in a range of $3 \leq r \leq 5$. Here, the ratio r is preferably a large value within the above range. That is, it is more preferable that r=5.

For example, the allowable maximum diameter D is a value within a range of 10 μm≤D≤100 μm. In this case, it is preferable that the arrangement pitch P, the width $f_1$ of the convex portions 51, the width $f_2$ of the concave portions 52, and the height h of the convex portions 51 take values as shown in FIG. 20. Here, $f_1/f_2=1$ and r=5. According to FIG. 20, the arrangement pitch P is preferably within a range of 0.2 μm<P<2 μm, and the height h of the convex portions 51 is preferably within a range of 0.2 μm<h<2 μm. Here, although the arrangement pitch P may be 0.2 μm or less from the viewpoint of tin repellency, if the arrangement pitch P is too small, the difficulty and cost of processing of the uneven structure 50 increase, and thus the lower limit of the arrangement pitch P is set to 0.2 μm.

The same applies to the Y direction. In order to exhibit tin repellency with respect to the tin particles having the allowable maximum diameter D, the above relationship may be satisfied in any one direction of the X direction and the Y direction.

As described above, by setting the uneven structure 50 to exhibit tin repellency with respect to the tin particles having the allowable maximum diameter D, the tin particles grown to a size exceeding the allowable maximum diameter D fall due to their own weight. Thus, the target substance M output from the nozzle hole 42a is suppressed from contacting with the tin particles having a size exceeding the correction limit by the stage mechanism 49.

6.2 Modification

Figure 21:
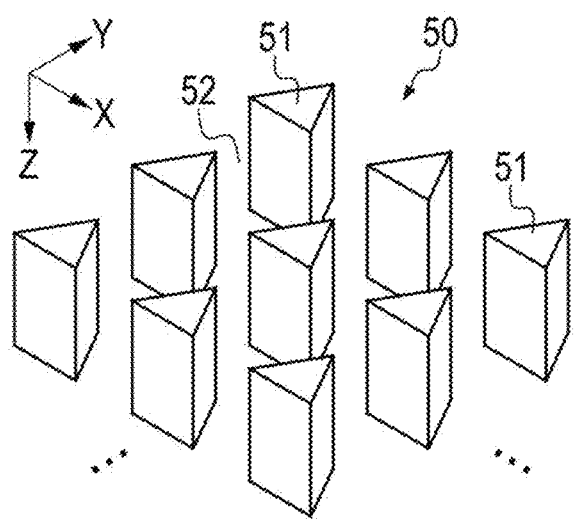
FIG. 21 is a perspective view showing a first modification of the uneven structure.
Figure 22:
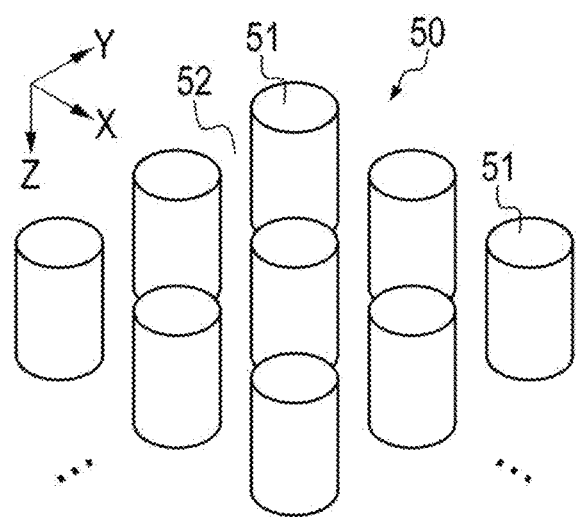
FIG. 22 is a perspective view showing a second modification of the uneven structure.

The shape of the uneven structure 50 can be variously modified. FIG. 21 to FIG. 27 show modifications of the shape of the uneven structure 50. In FIG. 19, the convex portions 51 are quadrangular prisms, but as shown in FIG. 21, the convex portions 51 may be triangular prisms. Further, the convex portions 51 may be polygonal prisms such as pentagonal prisms. Further, as shown in FIG. 22, the convex portions 51 may be circular columns. That is, the convex portions 51 may be polygonal prisms having three or more corners or circular columns.

Figure 23:
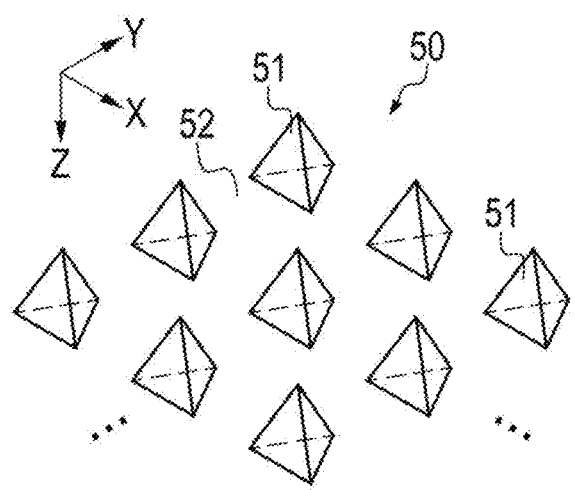
FIG. 23 is a perspective view showing a third modification of the uneven structure.
Figure 24:
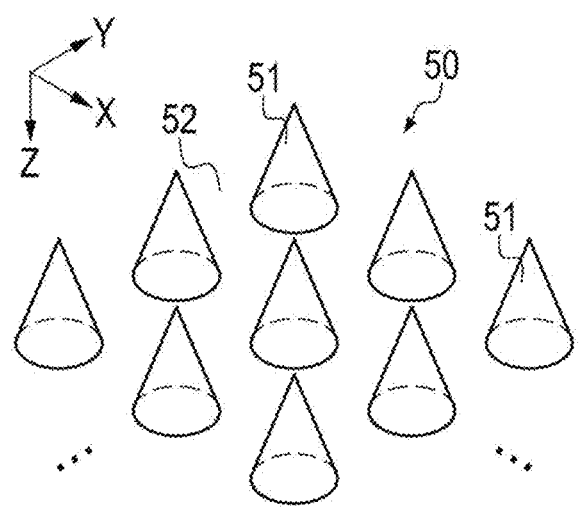
FIG. 24 is a perspective view showing a fourth modification of the uneven structure.
Figure 25:
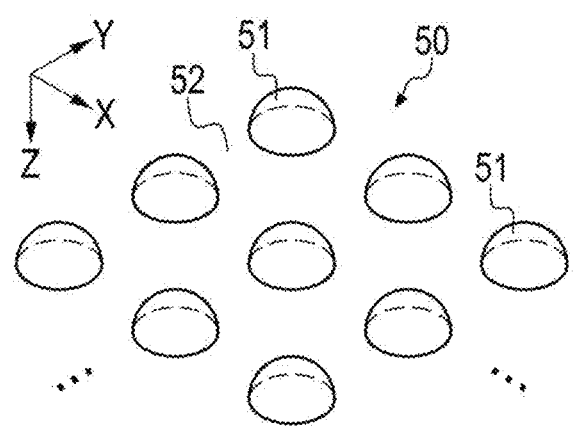
FIG. 25 is a perspective view showing a fifth modification of the uneven structure.

Further, as shown in FIG. 23, the convex portions 51 may be triangular pyramids. Further, as shown in FIG. 24, the convex portions 51 may be cones. That is, the convex portions 51 may be polygonal pyramids having three or more corners or cones. Further, as shown in FIG. 25, the convex portions 51 may be hemispheres.

Figure 26:
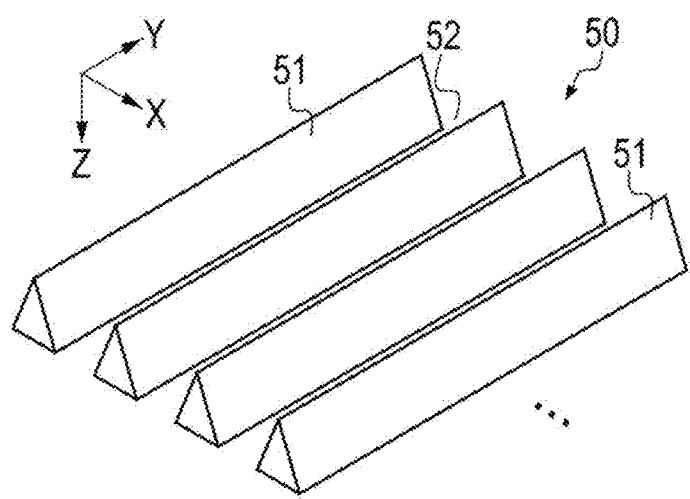
FIG. 26 is a perspective view showing a sixth modification of the uneven structure.
Figure 27:
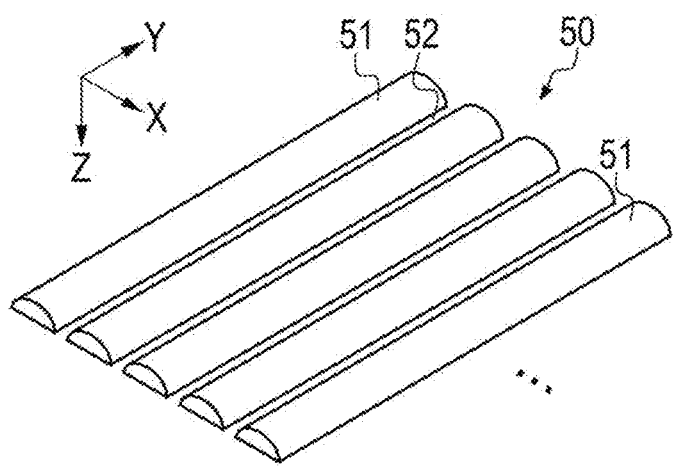
FIG. 27 is a perspective view showing a seventh modification of the uneven structure.

Further, as shown in FIG. 26, the convex portions 51 may have wall shapes each having a triangular cross section extending in one direction. The cross section is not limited to a triangle, and may be a polygon such as a quadrangle or a pentagon. Further, as shown in FIG. 27, the convex portions 51 may have wall shapes each having a semicircular cross section extending in one direction. That is, the convex portions 51 may have wall shapes each having a polygonal cross section or wall shapes each having a circular cross section.

Further, the convex portions 51 may be inverted polygonal pyramids or inverted cones as the polygonal pyramids or cones are inverted in the Z direction.

Here, the uneven structure 50 may have any structure as long as it exhibits tin repellency, and may have a structure in which a plurality of shapes are combined.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A target supply device configured to supply a liquid state target substance including tin to a concentration position of laser light to generate EUV light, the target supply device comprising:
    a tank configured to contain the target substance; and
    a nozzle communicating with an inside of the tank, and having a nozzle hole through which the target substance passes,
    an uneven structure being formed on a surface of the nozzle provided with the nozzle hole and facing the concentration position, the uneven structure exhibiting tin repellency larger than tin repellency exhibited by a material of the surface.

2. The target supply device according to claim 1, wherein the material of the surface is any one of molybdenum oxide, tungsten oxide, alumina, and quartz.

3. The target supply device according to claim 1, wherein the uneven structure is provided in a region surrounding the nozzle hole.

4. The target supply device according to claim 3, wherein the surface has, on an outside of the uneven structure, a flat region having tin repellency smaller than that of the uneven structure.

5. The target supply device according to claim 1, wherein the uneven structure has a plurality of convex portions and a plurality of concave portions, and the convex portions are arranged at a predetermined arrangement pitch in at least one direction.

6. The target supply device according to claim 5, wherein the arrangement pitch is more than 0.2 µm and less than 2 µm.

7. The target supply device according to claim 6, wherein a height of the convex portions is more than 0.2 µm and less than 2 µm.

8. The target supply device according to claim 5, wherein the convex portions are polygonal prisms, circular columns, polygonal pyramids, cones, or hemispheres, or have wall shapes each having a polygonal cross section, or wall shapes each having a circular cross section.

9. The target supply device according to claim 1, wherein a surface of the uneven structure includes an oxide film.

10. An electronic device manufacturing method, comprising:
    outputting EUV light generated using an EUV light generation apparatus including a target supply device to an exposure apparatus; and
    exposing a photosensitive substrate to the EUV light in the exposure apparatus to manufacture an electronic device,
    the target supply device configured to supply a liquid state target substance including tin to a concentration position of laser light to generate the EUV light, and including:
    a tank configured to contain the target substance; and
    a nozzle communicating with an inside of the tank, and having a nozzle hole through which the target substance passes,
    an uneven structure being formed on a surface of the nozzle provided with the nozzle hole and facing the concentration position, the uneven structure exhibiting tin repellency larger than tin repellency exhibited by a material of the surface.

11. An electronic device manufacturing method, comprising:
    inspecting a defect of a mask by irradiating the mask with EUV light generated using an EUV light generation apparatus including a target supply device;
    selecting a mask using a result of the inspection; and
    exposing and transferring a pattern formed on the selected mask onto a photosensitive substrate,
    the target supply device configured to supply a liquid state target substance including tin to a concentration position of laser light to generate the EUV light, and including:
    a tank configured to contain the target substance; and
    a nozzle communicating with an inside of the tank, and having a nozzle hole through which the target substance passes,
    an uneven structure being formed on a surface of the nozzle provided with the nozzle hole and facing the concentration position, the uneven structure exhibiting tin repellency larger than tin repellency exhibited by a material of the surface.

* * * * *